United States Patent
Nakamura et al.

(10) Patent No.: US 7,899,420 B2
(45) Date of Patent: Mar. 1, 2011

(54) WIRELESS TRANSMISSION DEVICE IN WHICH TRANSMISSION OUTPUT IS CONTROLLED IN FEEDBACK CONTROL

(75) Inventors: Shigeki Nakamura, Osaka (JP); Fumiya Kamimura, Osaka (JP); Junji Ito, Osaka (JP); Hidefumi Suzaki, Shiga (JP)

(73) Assignee: Panasonic Corporation, Osaka (JP)

( * ) Notice: Subject to any disclaimer, the term of this patent is extended or adjusted under 35 U.S.C. 154(b) by 683 days.

(21) Appl. No.: 12/014,316

(22) Filed: Jan. 15, 2008

(65) Prior Publication Data

US 2009/0011727 A1    Jan. 8, 2009

(30) Foreign Application Priority Data

Jan. 15, 2007    (JP) .............................. 2007-005631

(51) Int. Cl.
  *H04B 1/04*    (2006.01)
(52) U.S. Cl. .................... 455/127.3; 455/126; 330/254; 330/291
(58) Field of Classification Search .................... 455/91, 455/115.1, 126, 127.1, 127.2, 127.3; 330/75, 330/200, 254, 260, 278, 291, 296
  See application file for complete search history.

(56) References Cited

U.S. PATENT DOCUMENTS 6,980,780 B2 * 12/2005 Chen et al. ............... 455/127.1
7,783,272 B2 * 8/2010 Magnusen ................ 455/232.1
2005/0227646 A1 * 10/2005 Yamazaki et al. ........ 455/127.3

FOREIGN PATENT DOCUMENTS

| JP | 62-100010 | 5/1987 |
| JP | 01-137716 | 5/1989 |
| JP | 2004-153378 | 5/2004 |
| JP | 2005-191791 | 7/2005 |

OTHER PUBLICATIONS

Japanese Notice of Reasons for Rejection, w/ English translation thereof, issued in Japanese Patent Application No. JP 2007-005631 dated Sep. 14, 2010.

* cited by examiner

*Primary Examiner*—Blane J Jackson
(74) *Attorney, Agent, or Firm*—McDermott Will & Emery LLP

(57) ABSTRACT

A wireless transmission device includes a RF power amplification section for amplifying a transmit RF signal and outputting the amplified signal to a transmission antenna, a detector section, and a control section. The RF power amplification section includes a plurality of stages of amplification, the transmit RF signal is input to an input of a first one of the plurality of stages of amplification, and an output of a last one of the plurality of stages of amplification is output to the transmission antenna. The detector section includes a plurality of detectors provided so as to correspond to the plurality of stages of amplification, each for detecting an input level of a corresponding one of the stages of amplification, and a synthesizer for synthesizing together detection outputs from the plurality of detectors. The control section controls, in a feedback control, an output level of the RF power amplification section based on an output level of the synthesizer.

5 Claims, 7 Drawing Sheets

WIRELESS TRANSMISSION DEVICE IN WHICH TRANSMISSION OUTPUT IS CONTROLLED IN FEEDBACK CONTROL

CROSS-REFERENCE TO RELATED APPLICATIONS

This application claims priority under 35 U.S.C. §119 on Patent Application No. 2007-5631 filed in Japan on Jan. 15, 2007, the entire contents of which are hereby incorporated by reference.

BACKGROUND OF THE INVENTION

The present invention relates to a wireless transmission device capable of a feedback control in which the transmission output is controlled to a predetermined level.

FIG. 1 is a block diagram showing an internal configuration of a conventional wireless communications device. The wireless communications device includes an antenna 1, SPDT (Single Pole Double Throw) switches 6 and 8, filters 7, 10 and 11, a low-noise amplifier (LNA) 9, a transmit/receive signal processing section 2, a power amplifier 100, and an output power detector 3.

A transmit RF (Radio Frequency) signal generated by the transmit/receive signal processing section 2 is input to the power amplifier 100 via the filter 11. The power amplifier 100 amplifies the transmit RF signal. The transmit RF signal amplified through the power amplifier 100 is output to the antenna 1 via the SPDT switch 8, the filter 7 and the SPDT switch 6, and is transmitted to the outside from the antenna 1. The output signal of the power amplifier 100 is detected by the output power detector 3, and the detection output DETOUT.1 is an input of a transmission output level judgment function 4 of the transmit/receive signal processing section 2. If it judges that the transmission output level is insufficient, a transmission output level controlling function 5 of the transmit/receive signal processing section 2 increases the output level of the transmit RF signal generated by the transmit/receive signal processing section 2. If it judges that the transmission output level is excessive, the transmission output level controlling function 5 decreases the output level of the transmit RF signal. A feedback control is realized as described above to control the level of the signal transmitted from the antenna 1 to an intended level.

FIG. 2 shows an internal configuration of the power amplifier 100 and the output power detector 3 shown in FIG. 1.

The power amplifier 100 consists of multi-stage (three stages in the illustrated example) amplifier. which includes amplifiers 101, 102 and 103, and inter-stage matching networks 104 and 105. The transmit RF (Radio Frequency) signal generated by the transmit/receive signal processing section 2 of FIG. 1 is input to an RF signal input terminal 107 via the filter 11. The RF signal input terminal 107 is connected to the input of the amplifier 101 of the first stage. The output of the amplifier 101 is connected to one end of the inter-stage matching network 104. The other end of the inter-stage matching network 104 is connected to the input of the amplifier 102 of the following stage. The output of the amplifier 102 is connected to one end of the inter-stage matching network 105. The other end of the inter-stage matching network 105 is connected to the input of the amplifier 103 of the following stage (the last stage in the illustrated example). The output of the amplifier 103 of the last stage is connected to an RF signal output terminal 108. The signal output from the RF signal output terminal 108 is output to the antenna 1 via the SPDT switch 8, the filter 7 and the SPDT switch 6, and is transmitted to the outside from the antenna 1. The output of the amplifier 103 is also connected to one end of a detection diode 106 of the output power detector 3. The other end of the detection diode 106 is connected to a detection output terminal 109. The detection diode 106 detects the output power of the power amplifier 100 and outputs the detection results from the detection output terminal 109.

With the configuration shown in FIG. 2, the detection output DETOUT.1 from the detection output terminal 109 exhibits diode characteristics, thereby resulting in a low detection sensitivity for a lower range of the output level of the power amplifier 100. Therefore, in view of the controllability for lower output levels of the power amplifier 100, this cannot be said to be an effective circuit as the controllability of the wireless communications device is poor. Moreover, since the output of the power amplifier 100 is used as the input to the output power detector 3, the detection output DETOUT.1 from the output power detector 3 is influenced by the reflected signal due to the impedance mismatch in the antenna section. Therefore, the detection output is not stable, and the transmission output of the wireless communications device is also not stable.

SUMMARY OF THE INVENTION

According to the present invention, a wireless transmission device includes a RF power amplification section (100), a detector section (400), and a transmitting/receiving signal processing section (2) includes a control function (4, 5). The RF power amplification section (100) amplifies a transmit RF signal and outputs the amplified signal to a transmission antenna (1). The RF power amplification section (100) consists of multi-stage amplifier which includes amplifiers (101, 102, 103). The transmit RF signal is input to a first one (101) of the plurality of stages of amplification (101, 102, 103). An output of a last one (103) of the plurality of stages of amplification (101, 102, 103) is output to the transmission antenna (1). The detector section (400) includes a plurality of detectors (401, 402, 403), and a synthesizer (404). The plurality of detectors (401, 402, 403) are provided so as to correspond to the plurality of stages of amplification (101, 102, 103), each for detecting an input level of a corresponding one of the stages of amplification. The synthesizer (404) synthesizes together detection outputs from the plurality of detectors (401, 402, 403). The control function (4, 5) controls, in a feedback control, an output level of the RF power amplification section (100) based on an output level of the synthesizer (404).

In the wireless transmission device, a plurality of detectors (401, 402, 403) are provided so as to correspond to a plurality of stages of amplification (101, 102, 103), each for detecting the input level of the corresponding one of the plurality of stages of amplification. The detection outputs (DETOUT.a, DETOUT.b, DETOUT.c) of the detectors (401, 402, 403) successively saturate, stage by stage, from the detection output (DETOUT.c) of the detector (403) corresponding to the last one (103) of the plurality of stages of amplification (101, 102, 103) to the detection output (DETOUT.a) of the detector (401) corresponding to the first stage (101). The detection outputs (DETOUT.a, DETOUT.b, DETOUT.c) of the detectors (401, 402, 403) are synthesized together by the synthesizer (404) to obtain the final detection output (DETOUT.2). Then, it is possible to improve the linearity of the final detection output (DETOUT.2).

As opposed to the conventional detection method in which the output of the RF power amplification section (100) is used as the input to the detector section (3), the inputs of the plurality of stages of amplification (101, 102, 103) in the RF power amplification section (100) are used as the inputs to the detectors (401, 402, 403) of the detector section (400), respectively. Thus, the influence of the reflected signal due to the impedance mismatch in the antenna section is reduced, whereby it is possible to reduce the influence of variations in the output impedance on the detection output (DETOUT.2). As a result, the stability of the transmission output of the wireless transmission device is improved.

Since the linearity of the detection output (DETOUT.2) is improved, the system can be appropriately controlled even for a lower range of the output level of the RF power amplification section (100), thus improving the controllability of the wireless communications device.

DESCRIPTION OF THE PREFERRED EMBODIMENTS

Figure 1:
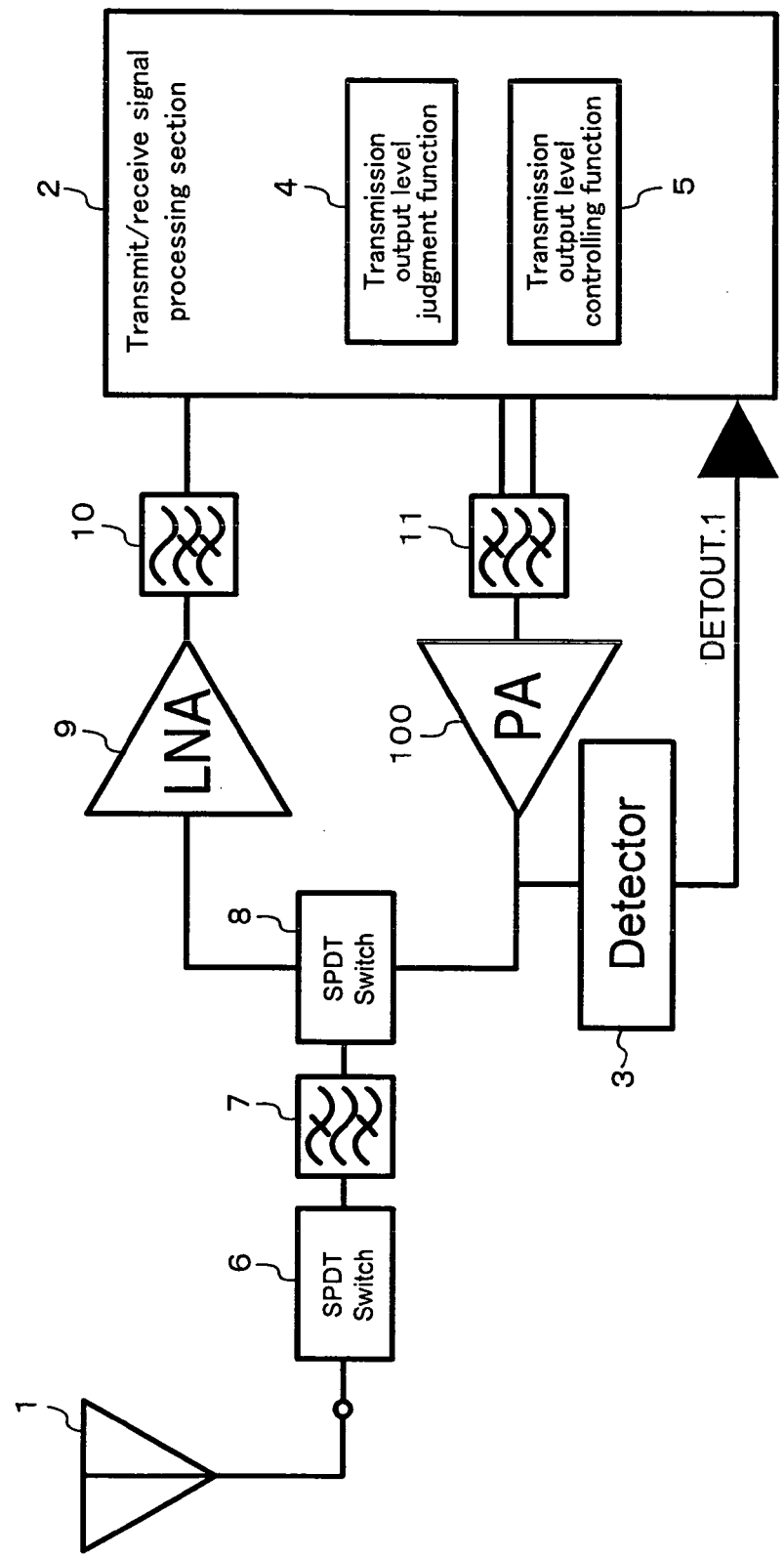
FIG. 1 is a block diagram showing an internal configuration of a conventional wireless communications device.
Figure 2:
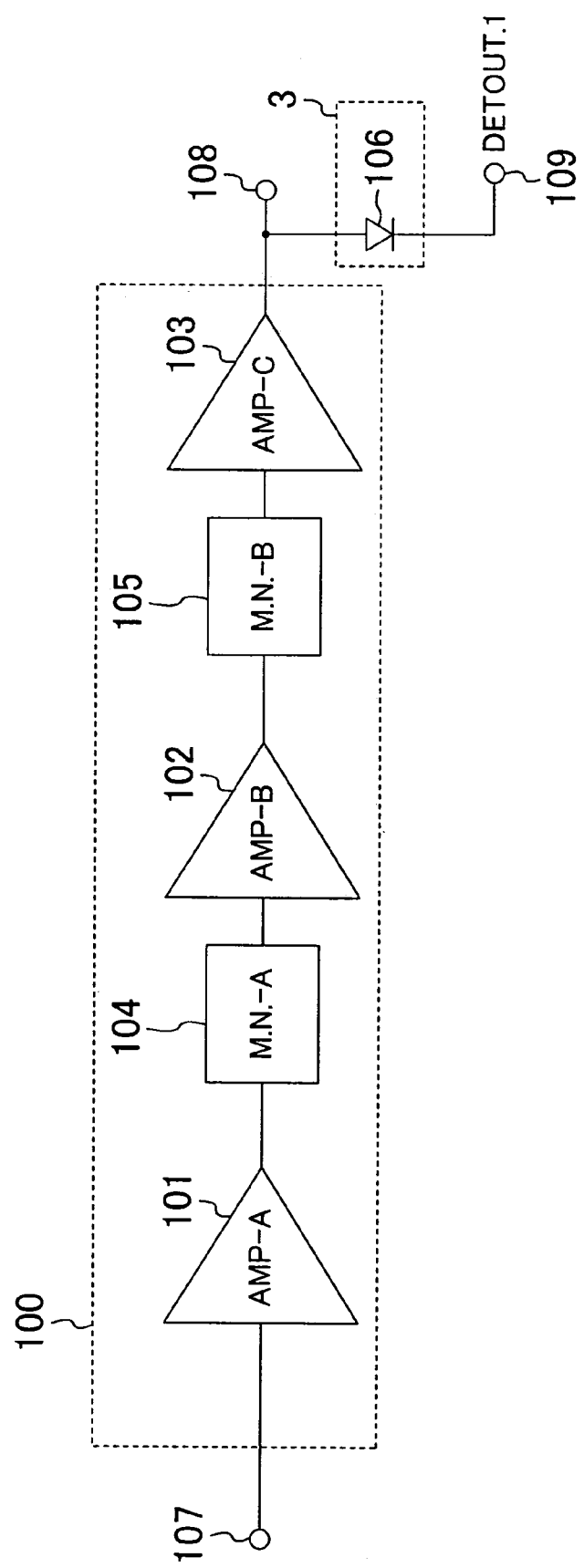
FIG. 2 is a block diagram showing an internal configuration of a power amplifier 100 and an output power detector 3 shown in FIG. 1.

An embodiment of the present invention will now be described in detail with reference to the drawings. Like elements are denoted by like reference numerals throughout the various figures.

Figure 3:
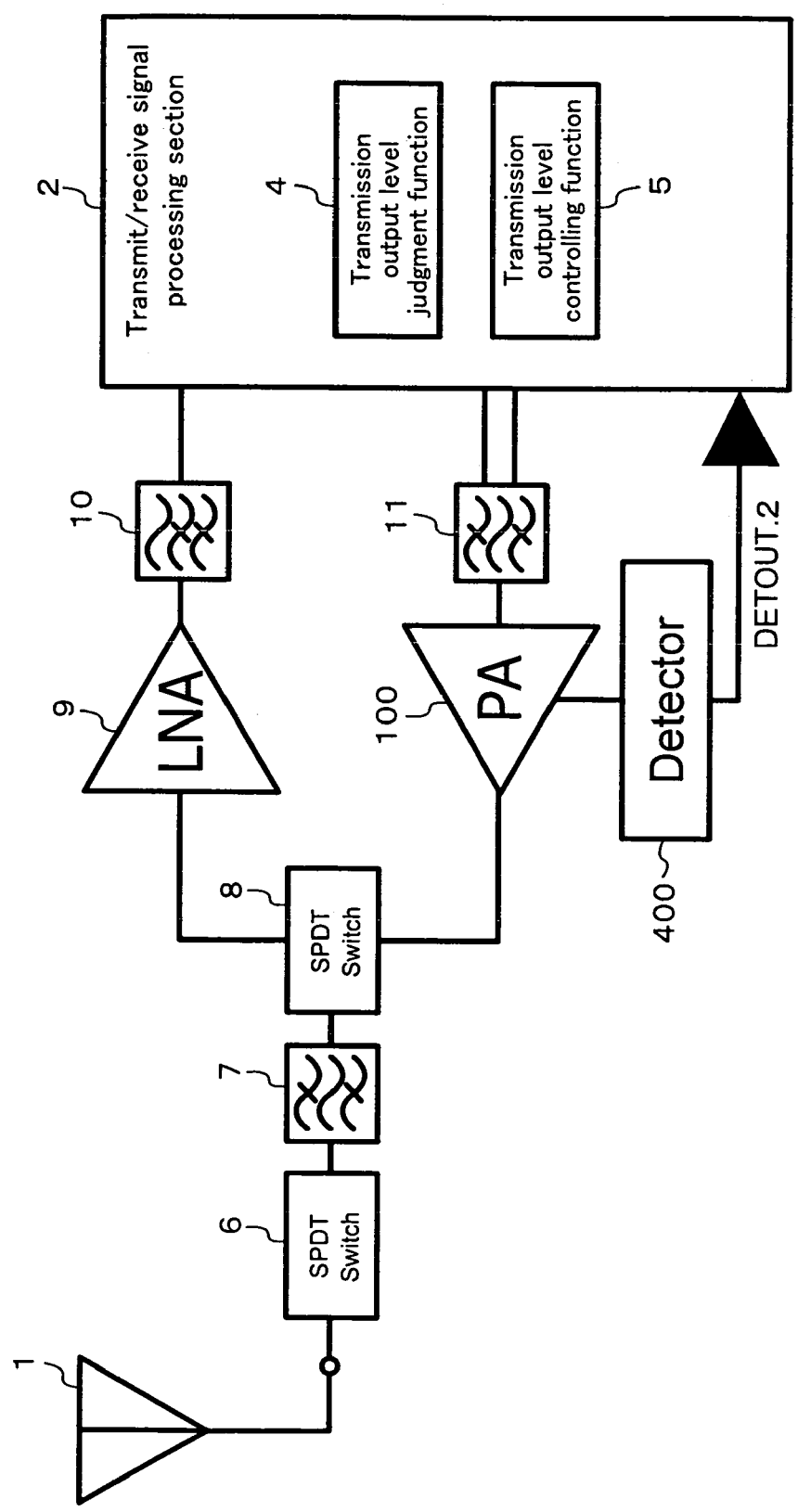
FIG. 3 is a block diagram showing an internal configuration of the wireless communications device according to an embodiment of the present invention.

FIG. 3 is a block diagram showing an internal configuration of the wireless communications device according to an embodiment of the present invention. The wireless communications device includes an antenna 1, SPDT (Single Pole Double Throw) switches 6 and 8, filters 7, 10 and 11, a low-noise amplifier (LNA) 9, a transmit/receive signal processing section 2, a power amplifier 100, and an output power detector 400.

A transmit RF (Radio Frequency) signal generated by the transmit/receive signal processing section 2 is input to the power amplifier 100 via the filter 11. The power amplifier 100 amplifies the transmit RF signal. The transmit RF signal amplified through the power amplifier 100 is output to the antenna 1 via the SPDT switch 8, the filter 7 and the SPDT switch 6, and is transmitted to the outside from the antenna 1. The output of the power amplifier 100 is detected by the output power detector 400, and the detection output DETOUT.2 is evaluated by a transmission output level judgment function 4 of the transmit/receive signal processing section 2. If it is judged that the transmission output level is insufficient, a transmission output level controlling function 5 of the transmit/receive signal processing section 2 increases the output level of the transmit RF signal generated by the transmit/receive signal processing section 2. If it is judged that the transmission output level is excessive, the transmission output level controlling function 5 decreases the output level of the transmit RF signal. A feedback control is realized as described above to control the level of the signal transmitted from the antenna 1 to an intended level. While FIG. 3 shows a configuration where the detection output DETOUT.2 is fed back to the transmit/receive signal processing section 2, the form of feedback control is not limited to this. The present invention is effective for wireless communications devices in general employing a feedback control based on the detection output DETOUT.2, and may employ, for example, a configuration where the detection output DETOUT.2 is fed back to the bias control section of the power amplifier 100 so as to control the degree of amplification of the power amplifier 100.

Figure 4:
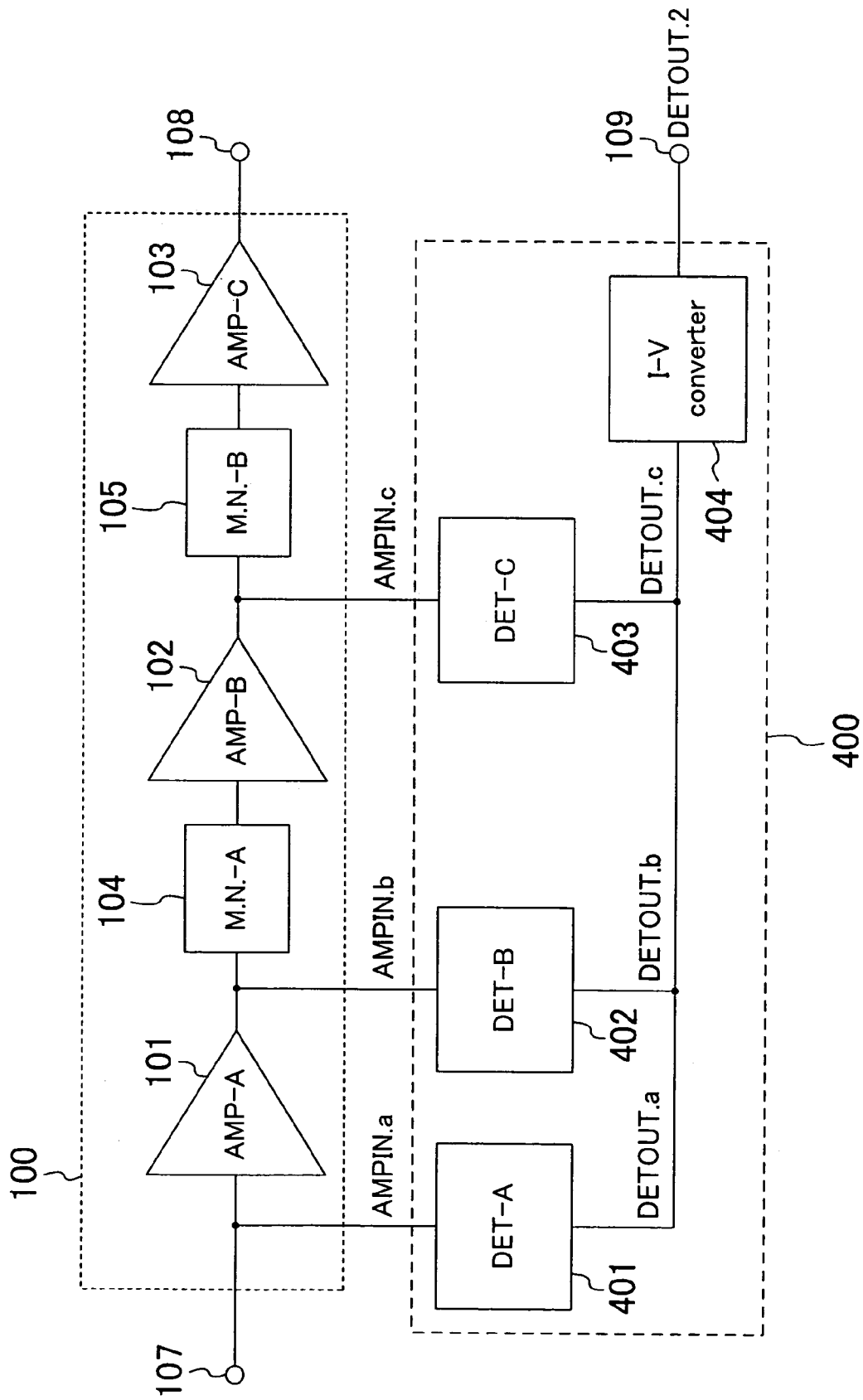
FIG. 4 is a block diagram showing an internal configuration of the power amplifier 100 and an output power detector 400 shown in FIG. 3.

FIG. 4 shows an internal configuration of the power amplifier 100 and the output power detector 400 shown in FIG. 3.

The power amplifier 100 includes a plurality of stages (three stages in the illustrated example) of amplifiers 101, 102 and 103, and inter-stage matching networks 104 and 105. The inter-stage matching networks 104 and 105 are inserted between the plurality of stages of the amplifiers 101, 102 and 103. The inter-stage matching networks 104 and 105 may consist of lossless components like a capacitor or an inductor. The output power detector 400 includes detectors 401, 402 and 403 and a current-voltage converter 404. The detectors 401, 402 and 403 correspond to the amplifiers 101, 102 and 103, respectively. The detector 401 detects an input AMPIN.a to the amplifier 101. The detector 402 detects an input AMPIN.b to the amplifier 102 before the input AMPIN.b passes through the inter-stage matching network 104. The detector 403 detects an input AMPIN.c to the amplifier 103 before the input AMPIN.c passes through the inter-stage matching network.

The transmit RF (Radio Frequency) signal generated by the transmit/receive signal processing section 2 of FIG. 3 is input to an RF signal input terminal 107 via the filter 11. The RF signal input terminal 107 is connected to the input of the amplifier 101 of the first stage and is also connected to the input of the detector 401. The output of the amplifier 101 is connected to one end of the inter-stage matching network 104, and is also connected to the input of the detector 402. The other end of the inter-stage matching network 104 is connected to the input of the amplifier 102 of the following stage. The output of the amplifier 102 is connected to one end of the inter-stage matching network 105, and is also connected to the input of the detector 403. The other end of the inter-stage matching network 105 is connected to the input of the amplifier 103 of the following stage (the last stage in the illustrated example). The output of the amplifier 103 of the last stage is connected to an RF signal output terminal 108. The signal output from the RF signal output terminal 108 is output to the antenna 1 via the SPDT switch 8, the filter 7 and the SPDT switch 6, and is transmitted to the outside from the antenna 1. The outputs of the detectors 401, 402 and 403 are connected commonly to the input of the current-voltage converter 404. The output of the current-voltage converter 404 is connected to the detection output terminal 109.

Figure 5:
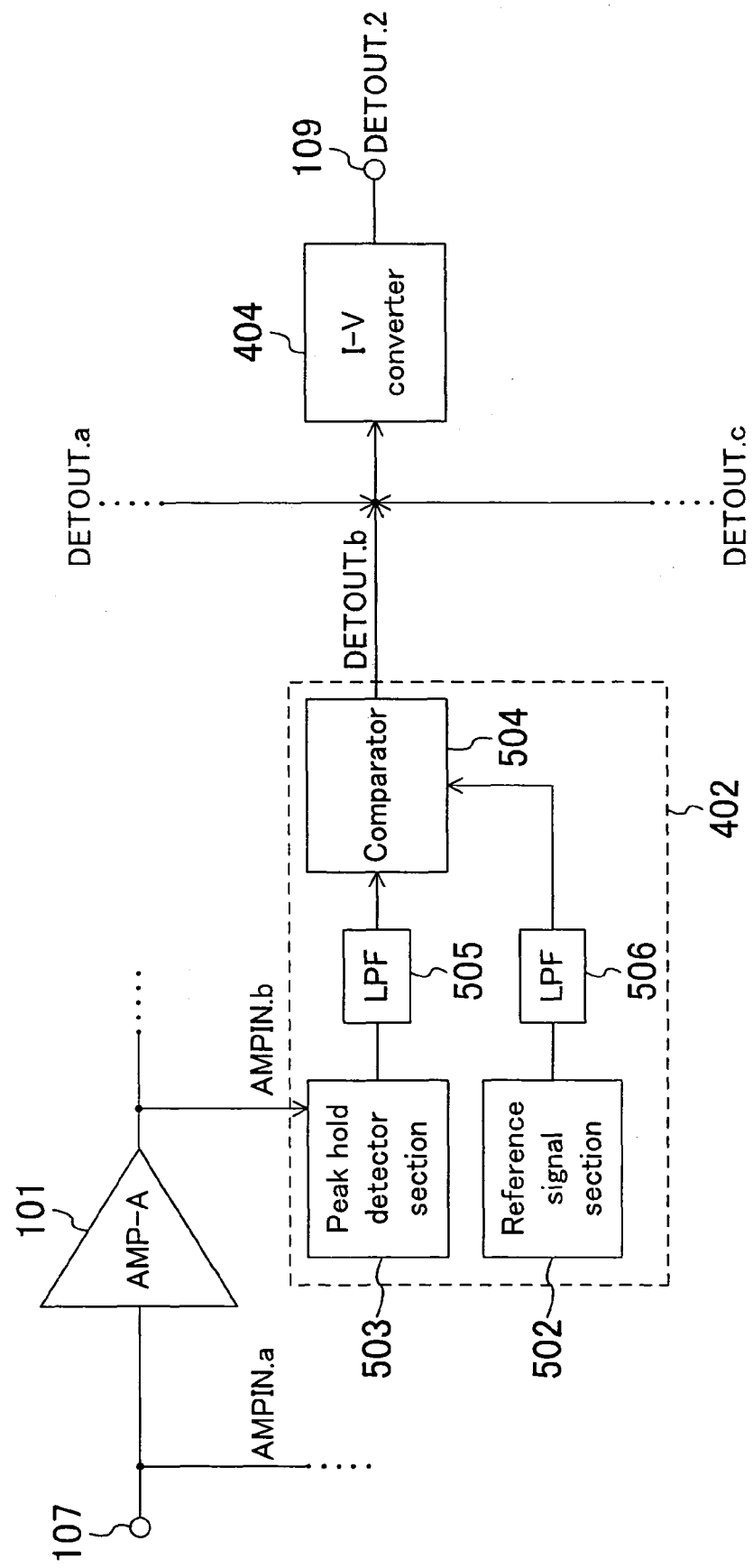
FIG. 5 is a block diagram showing an internal configuration of a detector 402 shown in FIG. 4.

The detectors 401, 402 and 403 have the same internal configuration. As an example, the internal configuration of the detector 402 is shown in FIG. 5. The detector 402 includes a peak hold detector section 503, a reference signal section 502, a comparator 504, and LPFs (Low-Pass Filters) 505 and 506.

The input AMPIN.b of the amplifier 102 is connected to the input of the peak hold detector section 503. The output of the peak hold detector section 503 is connected to one input of the comparator 504 via the LPF 505. The output of the reference signal section 502 is connected to the other input of the comparator 504 via the LPF 506. The output DETOUT.b of the comparator 504 is connected to the input to the current-voltage converter 404, together with the outputs DETOUT.a and DETOUT.c of the comparators 504 of the other detectors 401 and 403.

While the LPFs 505 and 506 are inserted in the detectors 401, 402 and 403 in the present embodiment, these LPFs may be optional, and the reference signal section 502 and the peak hold detector section 503 may be connected directly to the comparator 504.

While the power amplifier 100 includes three stages of amplifications in the present embodiment, the present invention is not limited to the three-stage configuration, and is effective for multi-stage power amplifier 100 including two or more stages of amplification. Note that there need to be provided an equal number of detectors, each having the same configuration as that of the detectors 401, 402 and 403, to the number of stages provided.

Figure 6:
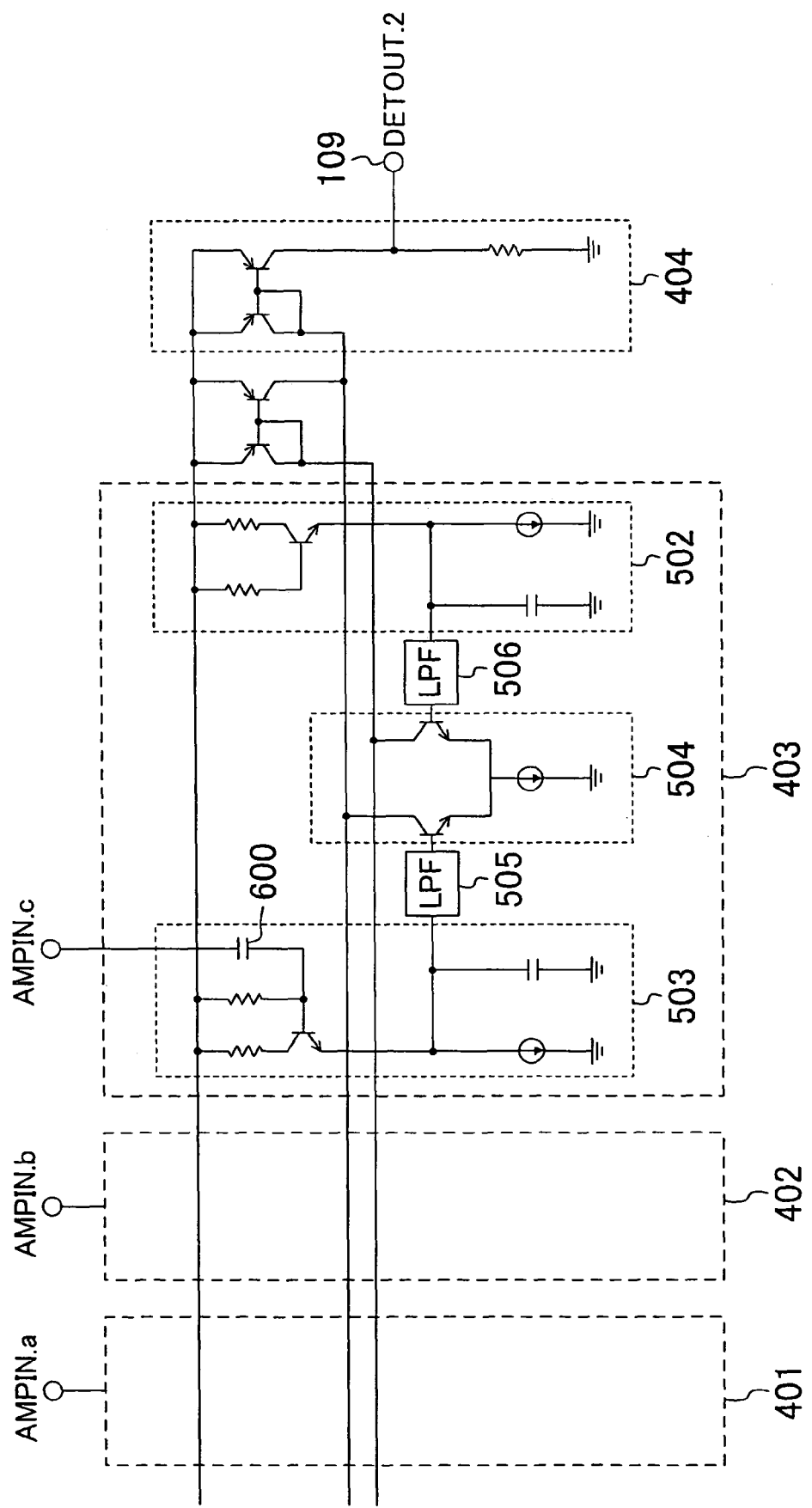
FIG. 6 is a circuit diagram showing an internal configuration of a detector 403 and a current-voltage converter 404 shown in FIG. 4.

FIG. 6 shows a detailed internal configuration of the detectors 401, 402 and 403 and the current-voltage converter 404. The detectors 401, 402 and 403 have the same internal configuration as described above, and FIG. 6 shows that of the detector 403 as an example.

A signal AMPIN.c from a stage of amplification (the input of the amplifier 103) is input to the input of the peak hold detector section 503 of the detector 403 via a DC component blocking capacitor 600. The peak hold detector section 503 detects the peak of the amplitude of the input signal AMPIN.c. The reference signal section 502 generates a DC reference voltage.

The comparator 504 is implemented as a differential amplifier circuit. The output of the peak hold detector section 503 and the DC voltage generated in the reference signal section 502 are input to the comparator 504. The comparator 504 outputs a current DETOUT.c according to the difference between the output of the peak hold detector section 503 and the reference voltage from the reference signal section 502. By arranging the peak hold detector section 503 and the reference signal section 502 in a symmetric arrangement, the DC components of inputs to the comparator 504 can be made equal to each other. Then, the influence of the DC component on the output DETOUT.c of the comparator 504 is negligible, whereby the comparator 504 only outputs components obtained by detecting the input signal component. Since the comparator 504 employs a differential configuration, even if the power supply voltage varies, the power supply voltage variations can be canceled out by each other, thereby leaving no influence on the detection output DETOUT.c. Thus, the influence of power supply voltage variations on the detection output DETOUT.c of the detector 403 is negligible. With the insertion of the LPF 505, the output component of the peak hold detector section 503 can be made into a smoother signal before being input to the comparator 504.

The above description similarly applies to the detectors 401 and 402.

The current-voltage converter 404 may be implemented with a resistor, for example. The output currents (detection outputs) DETOUT.a, DETOUT.b and DETOUT.c of the comparators 504 of the detectors 401, 402 and 403 are added together and input to the current-voltage converter 404, which is then converted to a voltage through the current-voltage converter 404 so as to be output from the detection output terminal 109 as the final detection output DETOUT.2.

While the differential amplifier and the current mirror of the comparator 504 are implemented by using bipolar transistors in the present embodiment, a similar but CMOS-based configuration will allow the system to be operated with a lower power supply voltage. Moreover, the temperature dependency of the detection output can be adjusted by adjusting the temperature dependency of the current source, whereby it is possible to obtain a detection output with less temperature dependency.

Figure 7:
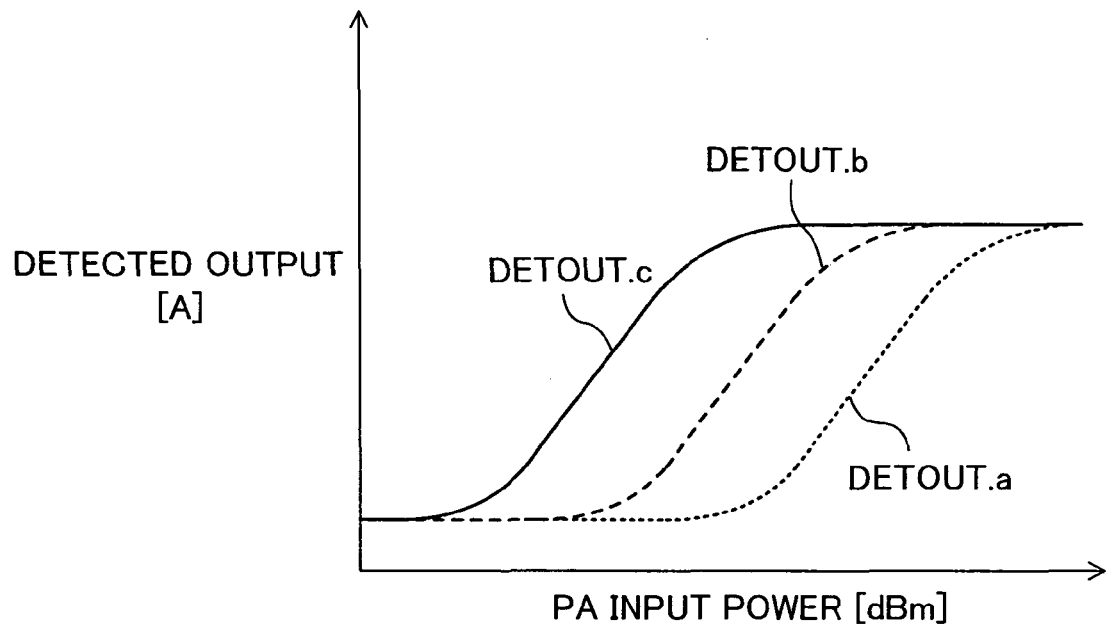
FIG. 7 is a graph showing detection outputs DETOUT.a, DETOUT.b and DETOUT.c of detectors 401, 402 and 403 shown in FIG. 4.
Figure 8:
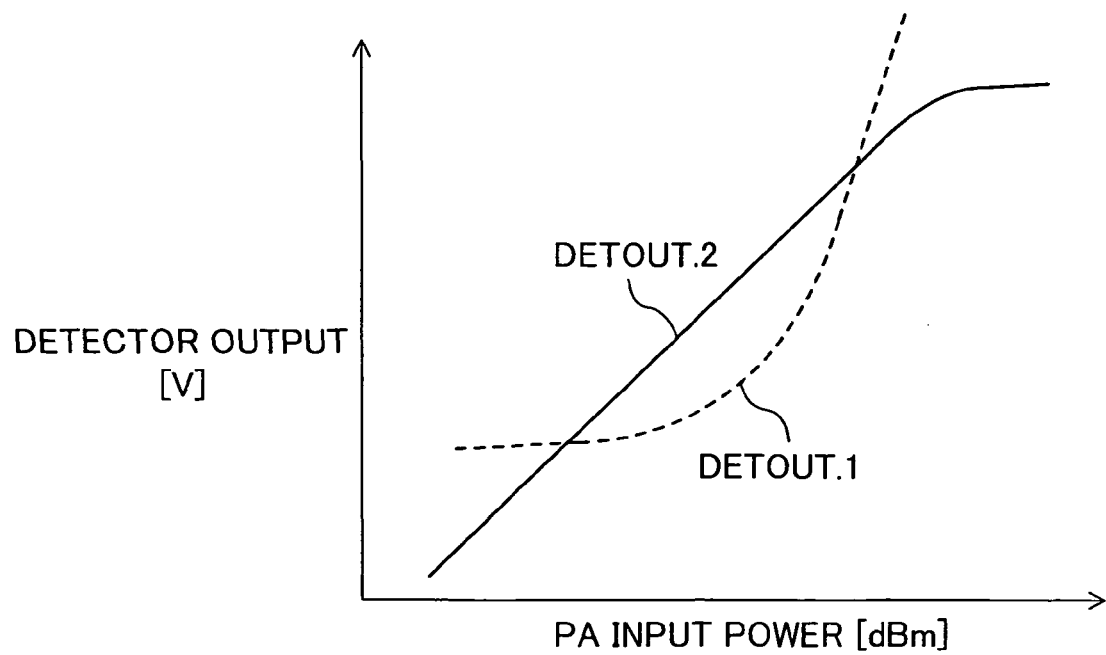
FIG. 8 is a graph showing a detection output DETOUT.2 according to an embodiment of the present invention and a detection output DETOUT.1 according to a conventional diode detection method.

FIG. 7 shows a graph of the currents of the detection outputs DETOUT.a, DETOUT.b and DETOUT.c from the detectors 401, 402 and 403, respectively. As shown in FIG. 7, the detection output DETOUT.c of the detector 403 corresponding to the amplifier 103 of the last stage first saturates, the detection output DETOUT.b of the detector 402 next saturates at a level that is shifted by the gain of the amplifier 102, and the detection output DETOUT.a of the detector 401 then saturates at a level that is shifted by the gain of the amplifier 101. Thus, the detection outputs saturate successively, with those of later stages of amplification saturating first. The detection outputs DETOUT.a, DETOUT.b and DETOUT.c combined together are subjected to a current-voltage conversion through the current-voltage converter 404 and output from the detection output terminal 109 as the detection output DETOUT.2, which is linear over a wide range of output of the power amplifier 100 as shown in FIG. 8.

As described above, in the present embodiment, a plurality of detectors 401, 402 and 403 are provided so as to correspond to the plurality of stages of the amplifiers 101, 102 and 103 in the power amplifier 100, for detecting the inputs AMPIN.a, AMPIN.b and AMPIN.c of the corresponding amplifiers 101, 102 and 103, respectively. The detection outputs DETOUT.a, DETOUT.b and DETOUT.c of the detectors 401, 402 and 403 successively saturate, stage by stage, from the detection output DETOUT.c of the detector 403 corresponding to the amplifier 103 of the last stage to the detection output DETOUT.a of the detector 401 corresponding to the amplifier 101 of the first stage. The detection outputs DETOUT.a, DETOUT.b and DETOUT.c of the detectors 401, 402 and 403 are added together and subjected to a current-voltage conversion through the current-voltage converter 404, thereby obtaining the final detection output DETOUT.2. Then, it is possible to improve the linearity of the detection output DETOUT.2 of the power amplifier 100. Thus, the detection sensitivity for a lower range of the output level of the power amplifier 100 is improved, thus improving the controllability of the wireless communications device.

As opposed to the conventional detection method in which the output of the power amplifier 100 is used as the input to the output power detector 3 (see FIG. 1), the inputs AMPIN.a, AMPIN.b and AMPIN.c of the plurality of stages of amplifiers 101, 102 and 103 in the power amplifier 100 are used as the inputs to the detectors 401, 402 and 403 of the output power detector 400, respectively. Thus, the influence of the reflected signal due to the impedance mismatch in the antenna section is reduced, whereby it is possible to reduce the influence of variations in the output impedance on the detection output DETOUT.2. As a result, the stability of the transmission output of the wireless transmission device is improved.

The temperature dependency of the detection output can be reduced by adjusting the temperature dependency of the current source of the detectors 401, 402 and 403, and it is possible to obtain a detection output that is not influenced by power supply voltage variations by employing a differential amplifier configuration for the comparator 504. As a result, the transmission output of the wireless communications device can be made stable.

While the present embodiment is directed to an amplifier in the signal transmitting section (the power amplifier 100), the output power detector 400 of the present embodiment can also be used in an amplifier in the signal receiving section. In the signal receiving section, however, the input to the amplifier 101 of the first stage of amplification is from the antenna section, and the detection output DETOUT.a of the detector 401 corresponding to the amplifier 101 of the first stage is influenced by impedance variations. Therefore, the detection output DETOUT.2 of the output power detector 400 may also vary due to the influence of the impedance variations. In contrast, in the signal transmitting section, the output impedance of the power amplifier 100 is influenced by the antenna section but the input impedance thereof is fixed, as shown in FIGS. 3 to 6. Therefore, in the signal transmitting section, there is a significant advantage that the detection output DETOUT.2 is unlikely to be influenced by the output impedance variations by employing a configuration as shown in FIGS. 3 to 6 for the output power detector 400.

What is claimed is:

1. A wireless transmission device, comprising:
   a RF power amplification section for amplifying a transmit RF (Radio Frequency) signal and outputting the amplified signal to a transmission antenna;
   a detector section; and
   a control section, wherein:
   the RF power amplification section includes a plurality of stages of amplification;
   the transmit RF signal is input to an input of a first one of the plurality of stages of amplification;
   an output of a last one of the plurality of stages of amplification is output to the transmission antenna;
   the detector section includes:
   a plurality of detectors provided so as to correspond to the plurality of stages of amplification, each for detecting an input level of a corresponding one of the stages of amplification; and
   a synthesizer for synthesizing together detection outputs from the plurality of detectors; and
   the control section controls, in a feedback control, an output level of the RF power amplification section based on an output level of the synthesizer.

2. The wireless transmission device of claim 1, wherein each of the plurality of detectors includes:
   a peak hold detector section for detecting a peak voltage of a signal that is input to a corresponding one of the plurality of stages of amplification;
   a reference signal section for generating a reference signal of a predetermined level; and
   a comparator for outputting a current based on a comparison between a detection output of the peak hold detector section and the reference signal,
   wherein the synthesizer includes a current-voltage converter for converting a sum of output currents from the comparators of the plurality of detectors to a voltage.

3. The wireless transmission device of claim 1, wherein the RF power amplification section further includes at least one inter-stage matching network inserted between the plurality of stages of amplification.

4. The wireless transmission device of claim 2, wherein each of the plurality of detectors further includes:
   a first low-pass filter provided between an output of the peak hold detector section and an input of the comparator; and
   a second low-pass filter provided between an output of the reference signal section and the input of the comparator.

5. The wireless transmission device of claim 1, wherein the detector section and the RF power amplification section each employ a CMOS (Complementary Metal-Oxide Semiconductor) configuration.

* * * * *